United States Patent [19]
Bazes

[11] Patent Number: 5,138,188
[45] Date of Patent: Aug. 11, 1992

[54] EDGE-SENSITIVE PULSE GENERATOR

[75] Inventor: Mel Bazes, Haifa, Israel

[73] Assignee: Intel Corporation, Santa Clara, Calif.

[21] Appl. No.: 727,655

[22] Filed: Jul. 9, 1991

[51] Int. Cl.$^5$ .................... H03K 3/017; H03K 5/04
[52] U.S. Cl. .................................... 307/265; 307/529;
                                                 328/154; 328/137
[58] Field of Search ............... 307/265, 243, 529;
                                           328/58, 61, 104, 137, 154

[56] References Cited

U.S. PATENT DOCUMENTS

| | | | |
|---|---|---|---|
| 4,580,064 | 4/1986 | Varnovitsky | 307/265 |
| 4,825,105 | 4/1989 | Hölzle | 307/243 |
| 4,931,986 | 6/1990 | Daniel et al. | 328/61 |

FOREIGN PATENT DOCUMENTS 1506528  9/1989  U.S.S.R. ............... 307/265

OTHER PUBLICATIONS

Stofka, "Pulser Provides Variable Start, Stop Times", Electronic Design News, vol. 26, No. 18, Sep. 16, 1981 p. 207.

Primary Examiner—Timothy P. Callahan
Attorney, Agent, or Firm—Blakeley, Sokoloff, Taylor & Zafman

[57]  ABSTRACT

An edge-sensitive pulse generator generating an output pulse having an arbitrary start time and an arbitrary stop time is described. The pulse generator includes a multiplexor whose output is selected by control signals. Inputs to the multiplexor include a start signal having a leading edge representative of said arbitrary start time and a trailing edge, and a stop signal having a leading edge representative of said arbitrary stop time and a trailing edge. The pulse generator also includes control logic for generating the control signals from the start signal and the stop signal. The control signals select the start signal as the multiplexor output after the trailing edge of the start signal and deselect the start signal as the mutiplexor output after the leading edge of said start signal. The control signals also select the stop signal as the multiplexor output after the trailing edge of the stop signal and select the stop signal as the multiplexor output after the leading edge of the stop signal.

17 Claims, 7 Drawing Sheets

FIG_2

FIG_4

FIG_3

FIG_5

FIG_6

FIG_7

FIG_8

EDGE-SENSITIVE PULSE GENERATOR

FIELD OF THE INVENTION

The present invention relates to the generation of timing pulses having arbitrary start and stop times. More particularly, the present invention relates to an edge-sensitive pulse generator for use in complementary metal oxide-semiconductor (CMOS) integrated circuits.

BACKGROUND OF THE INVENTION

Pulse generators generate output pulses with arbitrary start and stop times. Generally, the leading edges of two trigger signals, START and STOP, determine the pulse start and stop times. The trailing edges of trigger signals should have no effect upon the pulse generator's output pulse width. Combinations of synchronous delay line (SDL) tap outputs typically provide pulse generator trigger signals. Six basic combinations of trigger timings, as shown in FIG. 1, can be generated usign SDL taps. The leading edges are shown as rising edges. However, without any loss of generality, the leading edges could be both falling edges or some combination of rising and falling edges. The polarity of the leading edges is entirely a design choice.

There are two types of pulse generators which can be constructed to operate with the trigger signals of FIG. 1: level-sensitive pulse generators and edge-sensitive pulse generators. No type of level-sensitive pulse generaotr wil operate with all six trigger combinations shown in FIG. 1. For example, a simple Set-Reset flip-flop will operate only with the combination of trigger signals shown in FIG. 1A. Other level-sensitive pulse generators operate with some combination of the trigger signals shwon in FIGS. 1B–1D. No level-sensitive pulse generators operates with the combination of trigger signals shwon in FIGS. 1E and 1F.

Only an edge-sensitive pulse generator operates with all six combinations of trigger signals shown in FIG. 1. The relative complexity of edge-sensitive pulse generators counterbalances their versatility. As the complexity of edge-sensitive pulse generators increases so does the input-to-output delay. Complexity of design in integrated circuit pulse generators is often accompanied by a reduction in accuracy and increased input-to-output delay, sensitivity to process, supply voltage and temperature variations.

SUMMARY OF THE INVENTION

One of the objectives of the present invention is to provide an integrated circuit edge-sensitive pulse generator with reduced input-to-output delay.

Another objective of the present invention is to provide an edge-sensitive pulse generator which is insensitive to trailing edges.

Another objective of the present invention is to provide a pulse gnerator modifiable to respond to all combinations of leading edge polarities.

An edge-sensitive pulse generator for generating an output pulse having an arbitrary start time and an arbitrary stop time is described. The pulse generator includes a multiplexor whose output is selected by control signals. Inputs to the multiplexor include a start signal having a leading edge representativ of the arbitrary start time and a trailing edge, and a stop signal having a leading edge representative of the arbitrary stop time and a trailing edge. The pulse generator also in includes control logic which generates the control signals using the start signal and the stop signal. The control signals select the start signal as the multiplexor output after the trailing edge of the start signal and deselect the start signal as the multiplexor output after the leading edge of said start signal. The control signals also select the stop signal as the multiplexor output after the trailing edge of the stop signal and deselect the stop signal as the multiplexor output after the leading edge of the stop signal.

Other objects, features, and advantages of the present invention with be apparent from the accompanying drawings and the detailed description the follows.

BRIEF DESCRIPTION OF THE FIGURES

The present invention is illustrated by way of example and not limitation in the figures of the accompanying drawings in which references indicate similar elements and in which:

FIG. 1(a–f) is a timing diagram of the six basic combinations of trigger timings;

DETAILED DESCRIPTION

Figure 1A:
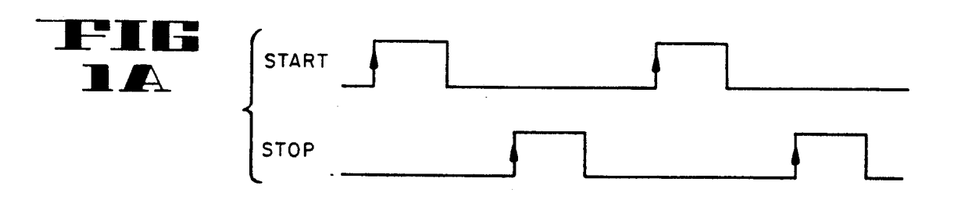
Figure 1B:
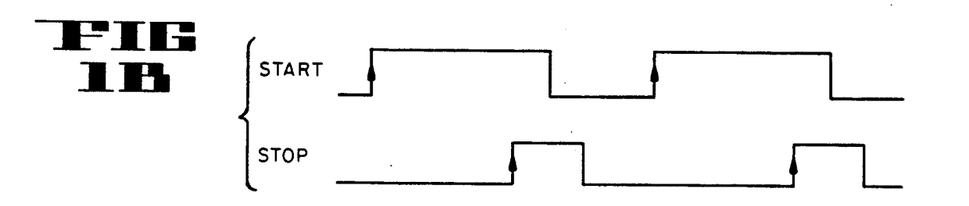
Figure 1C:
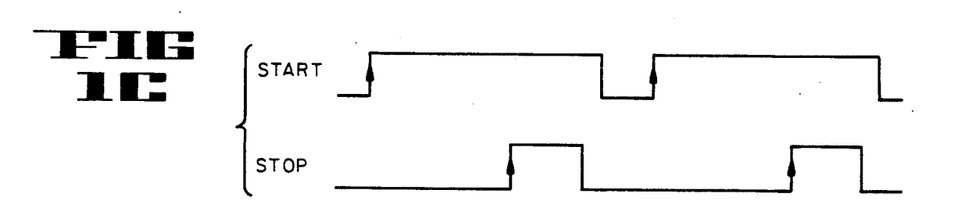
Figure 1D:
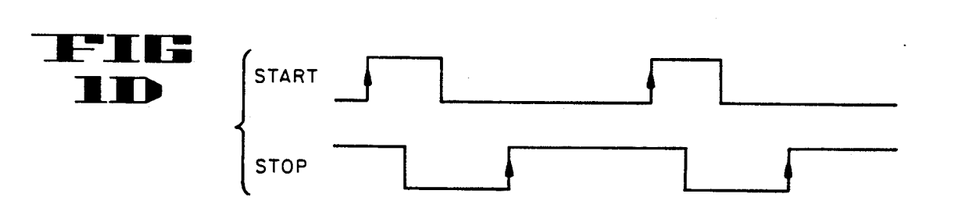
Figure 1E:
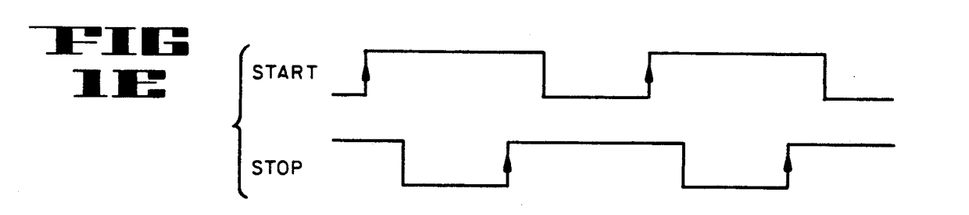
Figure 1F:
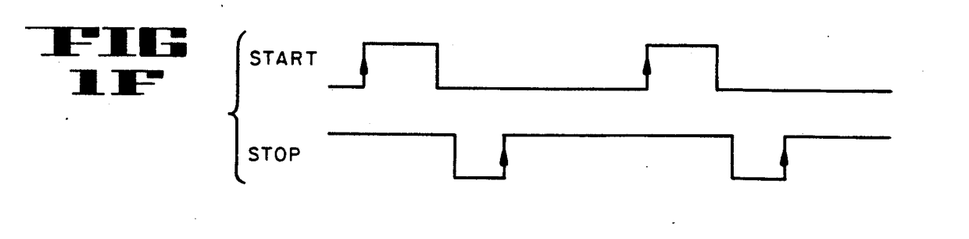
Figure 2:
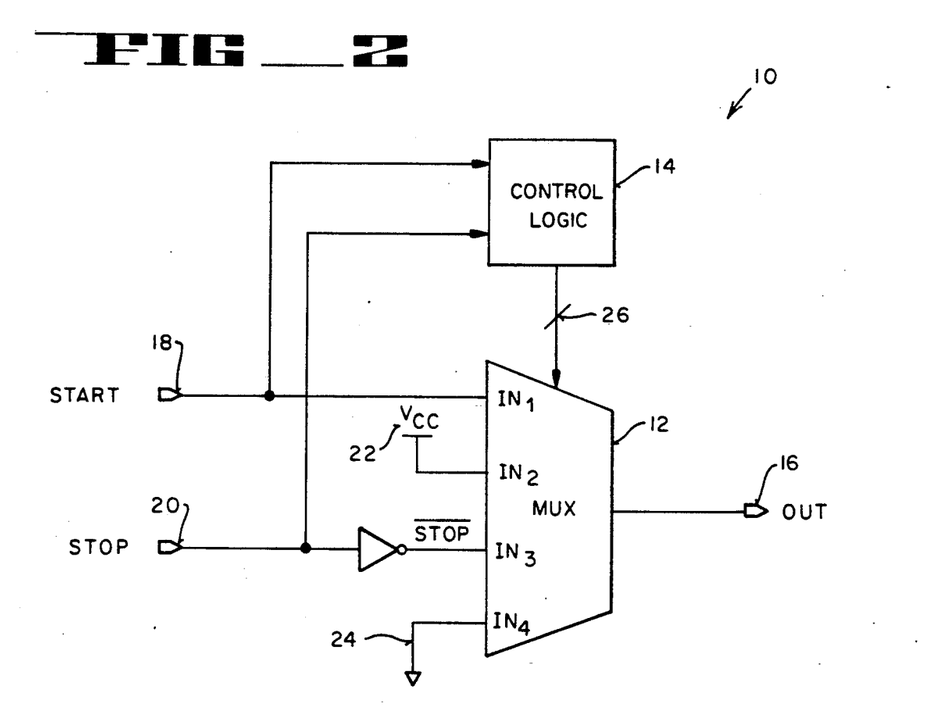
FIG. 2 is a block diagram of the edge-sensitive pulse generator.

FIG. 2 illustrates in block diagram form the edge-sensitive pulse generator 10 of the present invention. Pulse generator 10 includes multiplexor 12 and control logic 14, which selects the input to be output from multiplexor 12. Pulse generator 10 generators an output signal OUT 16 with arbitrary start and stop times. OUT 16 goes high with the leading edge of START 18 and goes low upon the leading edge of STOP 20. In the embodiment shown, the leading edges of START and STOP are chosen to be rising, while the trailing edges are falling. However, the polarities of the leading edges of either or both START and STOP pulses can be inverted by the addition or subtraction of an inverter to the appropriate input, as will be discussed below.

Multiplexor 12 is a 4-1 transmission gate multiplexor. Control signals 26 select which of the multiplexor's four inputs is output as OUT 16. The four multiplexor inputs are START 18, STOP 20, Vcc 22 and GND 24. START 18 and STOP 20 are binary signals, e.g. both signals 18 and 20 vary between a high voltage level and a low voltage level. The rising edge of START 18 indicates the arbitrary start time for output pulse OUT 16. Similarly, the rising edge of STOP 20 indicates the arbitrary stop time OUT 16. Vcc 22 is a substantially constant high voltage level applied to one of the multiplexor inputs. GND 24 is a substantially constant low voltage level applied to another of the multiplexor inputs.

Typically, the low voltage level of START 18, STOP 20 and GND 24 is approximately 0 volts, i.e. ground, and the high voltage for START 18, STOP 20 and Vcc 22 is within a range of 2.5–5 volts. The high and low voltage levels are a function of the logic family in which the pulse generator is implemented, and do not limit the present invention.

Control logic 14 generates control signals 26. Like multiplexor 12, control logic 14 receives START 18 and STOP 20 as inputs. Based upon the rising and falling edges of START 18 and STOP 20, control logic 14 selects the appropriate sequence of multiplexor inputs, 18, 20, 22, and 24, to generate an output pulse OUT 16 which goes high on the rising edge of START 18 and remains high until the rising edge of STOP 20. After the rising edge of STOP 20, OUT 16 fals and remains low until the next rising edge of START 18. Control logic 14 provides pulse generator 10 with falling edge insensitivity by disconnecting trigger inputs, START 18 and STOP 20, from the output OUT 16 immediately after the rising edge of signals 18 and 20. Control logic 14 reconnects trigger inputs 18 and 20 only after their falling edges.

Figure 3:
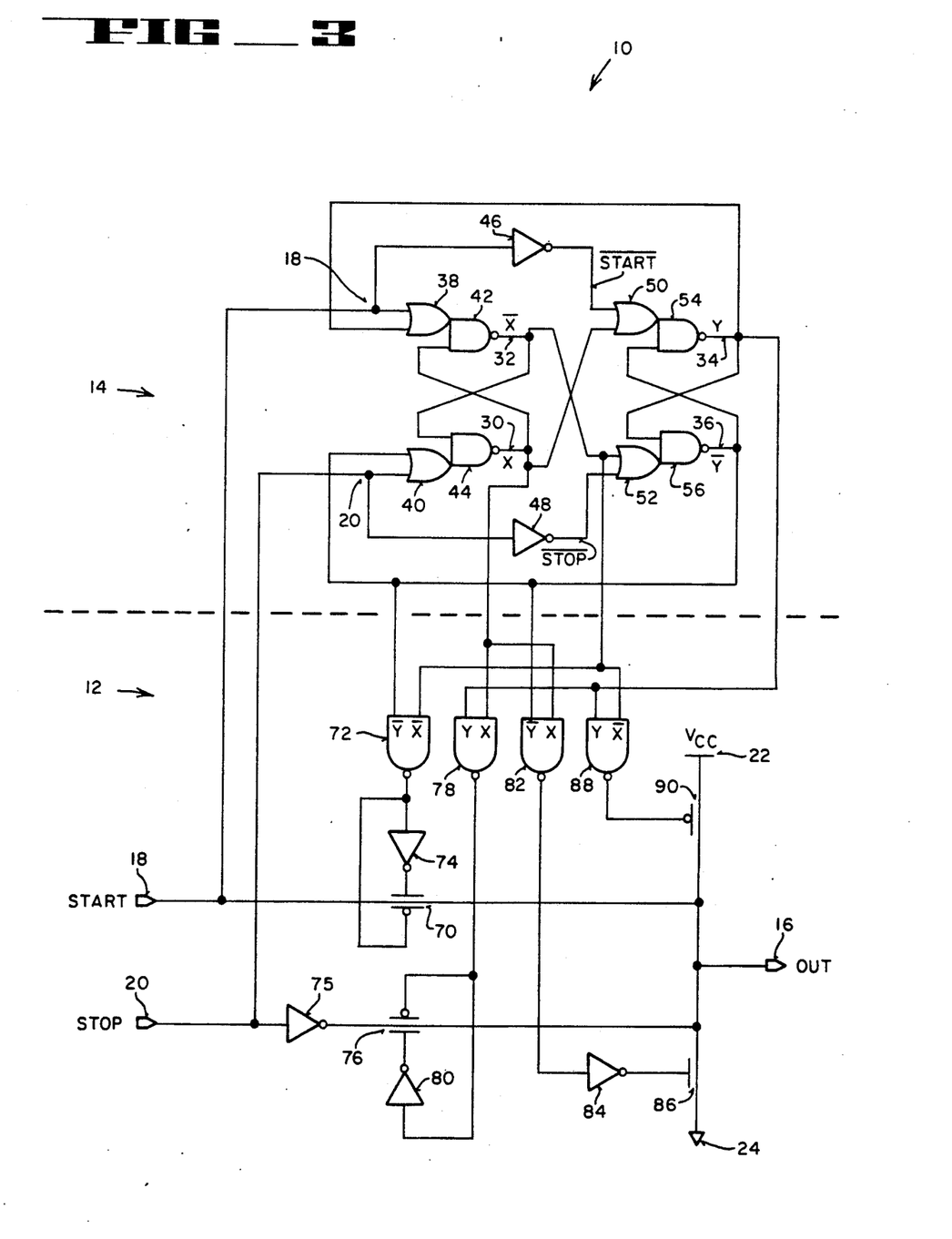
FIG. 3 is a schematic diagram of the edge-sensitive generator.

FIG. 3 illustrates schematically a CMOS implementation of multiplexor 12 and control logic 14.

The design of control logic 14 centers around two sets of cross coupled NAND gates 42, 44, and 54, 56. Each set of cross coupled NAND gates receives two inputs and generates two outputs. OR gates 38 and 40 form two of the inputs. The other inputs are the outputs from the other set of NAND gates. The four NAND gate outputs 30, 32, 34, and 36 form control signals 26.

START 18 is input to OR gate 38 and STOP 20 is input to OR gate 40. The output of each OR gater is fed to an input of cross coupled NAND gates 42 and 44. NAND gate 42 outputs control siganl $\overline{X}$ 32 and NAND gate 44 outputs control signal X 30.

Gates 46 and 48 invert START 18 and STOP 20 prior to their application to the second set of OR gates 50 and 52. OR gate 50 receives $\overline{START}$ and control signal X 30 as inputs. OR 50 connects to NAND gate 54, which outputs control signal Y 34. OR gate 52 receives $\overline{STOP}$ and control signal $\overline{X}$ 32 as inputs. Gate 52 connects to NAND 56, which outputs control signal $\overline{Y}$ 36. Control signals Y 34 and $\overline{Y}$ 36 are fed back around to OR gates 38 and 40, respectively.

Multiplexor 12 is relatively simple, including 4 NAND gates, 3 inverters, two pass devices and two transistors. Multiplexor 12 provides pulse generator 10 with a short input-to-output delay via pass devices 70 and 76.

START 18 is input to pass device 70, which is controlled by NAND gate 72 and inverter 74. Control signals $\overline{X}$ 32 and $\overline{Y}$ 36 are input to NAND 72. Thus, START 18 is output to OUT 16 only when YX=00. After inversion by inverter 75, STOP 20 is input to pass device 76. Pass device 76 is controlled by NAND gate 78 and inverter 80. NAND 78 selects STOP 20 as output when its input, X 30 and Y 34, are 11. GND 24 is connected to OUT 16 through NAND gate 82, inverter 84 and N-type transistor 86. Control signals X 30 and $\overline{Y}$ 36 are input to NAND 82. Thus, GND 24 is output only when YX=01. The final multiplexor input, Vcc 22, is connected to OUT 16 through NAND gate 88 and P-type transistor 90. NAND gate 88 receives control signals Y 34 and $\overline{X}$ 32 as inputs, thus outputting Vcc 22 only when YX=10.

Figure 4:
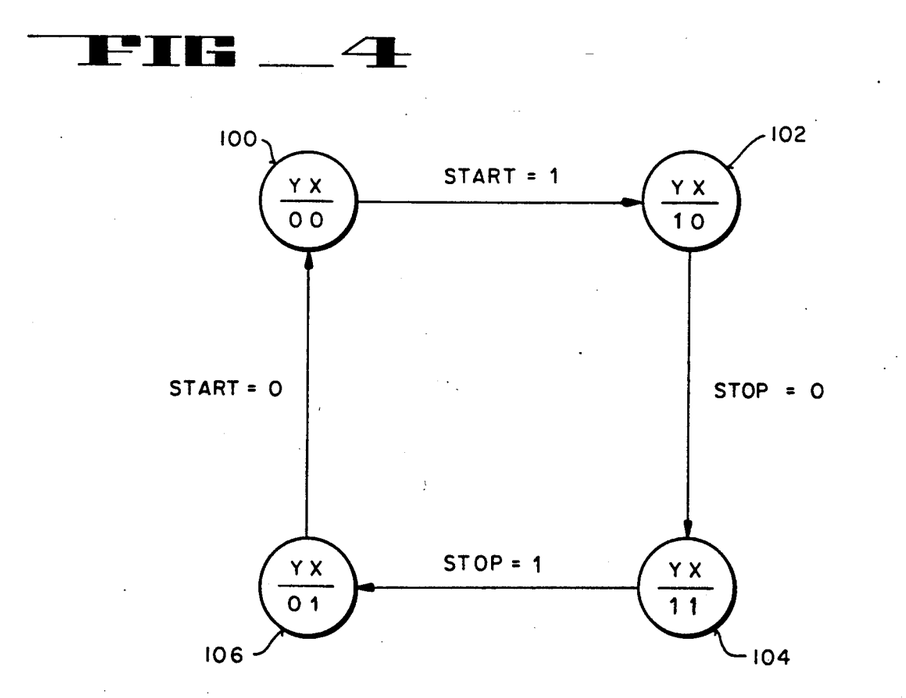
FIG. 4 is a state-transition diagram for the edge-sensitive pulse generator.

The operation of pulse generator 10 can be understood with reference to the state-transition diagram of FIG. 4. FIG. 4 denotes the four possible states of control logic 14 with circles containing the values of Y 34 and X 30 for that particular state. The arrows between states idicate possible transitions between states, with the input signal, START 18 or STOP 20, causing the transition indicated above the arrow.

In the discussion that follows, the rising edges of both STOP 20 and START 18 are treated as leading edges, while the falling edges of signals 18 and 20 are treated as trailing edges. However, pulse generator 10 can be modified to respond to different polarity leading and trailing edges of signals 18 and 20. Thus, the discussion that follows applied generally to all polarity trigger signals.

Assume that the control logic 14 is in state 100, in which YX=00. START 18 is passed to output OUT 16 because the output of NAND gate 72 is low, turning pass device 70 ON. OUT 16 is at a low voltage level because START 18 must be at its low voltage level for control logic 14 to remain in state 100. Once control logic 14 enters state 100, STOP 20 has no effect upon Y 34, X 30 or OUT 16. Only the transition of START 18 from a low voltage level to a high voltage level will move control logic 14 out of state 100.

OUT 16 follows START 18 when signal 18 transitions from a low level to a high level. In other words, OUT 16 changes polarity on the leading edge of START 18. Control logic 14 continues to select START 18 for a short period of time after the leading edge of START 18 because the input-to-output time of pass device 70 is less than the input-to-output time of contol logic 14. Some period of time after the leading edge of START 18 control logic 14 moves from state 100 to state 102. Control signals Y 34 and X 30 equal 10 in state 102. This combination of control signals forces the output of NAND gate 72 high, turning pass device 70 OFF and disconnecting START 18 from multiplexor output 16. At the same time, the output of NAND gate 88 goes low causing transistor 90 to conduct and to place Vcc 22 on multiplexor output 16. Thus, OUT 16 remains at a high voltage level even after START 18 has been disconnected from OUT 16.

In state 102, START 18 no longer affects the values of Y 34, X 30 or OUT 16. Only the transition of STOP 20 from a high voltage level to a low voltage level, i.e., the trailing edge of STOP 20, moves control logic 14 out of state 102.

Control logic 14 transitions to state 104 from state 102 when STOP 20 goes low. In other words, control logic 14 moves to state 104 with the trailing edge of STOP 20. Alternatively, if STOP is already low when control logic 14 enters stage 102, control logic 14 proceeds immediately to state 104. Control signals Y 34 and X 30 equal 11 in state 104. In state 104, NAND gate 88 and transistor 90 disconnect Vcc 22 from OUT 16. Control signals 30 and 34 turn pass device 76 ON, connecting an inverted version of STOP 20 to OUT 16. Because STOP 20 is selected only after its falling edge, OUT 16 is insensitive to the trailing edge of STOP 20. OUT 16 remains at a high voltage level after Vcc 22 is disconnected because STOP 20 is low.

OUT 16 goes low with the rising edge of STOP 20, which is treated as a leading edge. Control logic 14 continues to select STOP 20 for a short period of time afterward because the input-to-output time of pass device 76, is less than the input-to-output time of control logic 14. Some period of time after the leading edge of STOP 20 control logic 14 moves from state 104 to state 106. Control signals Y 34 and X 30 equal 01 in state 106. This combination of control signals forces the output of NAND gate 78 high, turning pass device 76 OFF and disconnecting STOP 20 from the multiplexor output 16. At the same time, the output of NAND gate 82 goes low causing transistor 86 to conduct and place GND 24 on OUT 16. Thus, OUT 16 remains at a low voltage level even though STOP 20 has been disconnected from the multiplexor output.

In state 106, STOP 20 no longer effects the values of Y 34, X 30 or OUT 16. Only the trailing edge of START 18, i.e. a transition from a high voltage level to a low voltage level, moves control logic 14 out of state 106.

Control logic 14 transitions to state 100 from state 106, when START 18 goes low. Alternatively, if START 18 is already low when control 14 enters state 106, control logic 14 proceeds immediately to state 100. Control signals Y 34 and X 30 equal 00 in state 100. In response, NAND gate 82, inverter 84, and transistor 86 disconnect GND 24 from OUT 16. Control signals X 30 and Y 34 turn pass device 70 ON, passing START 18 out to OUT 16. Because START 18 is selected only after its falling edge, OUT 16 is insensitive to the falling edge of START 18. OUT 16 remains at a low voltage level because START 18 is low. Pulse generator 10 is now prepared to respond to another set of START and STOP rising edges.

Figure 5:
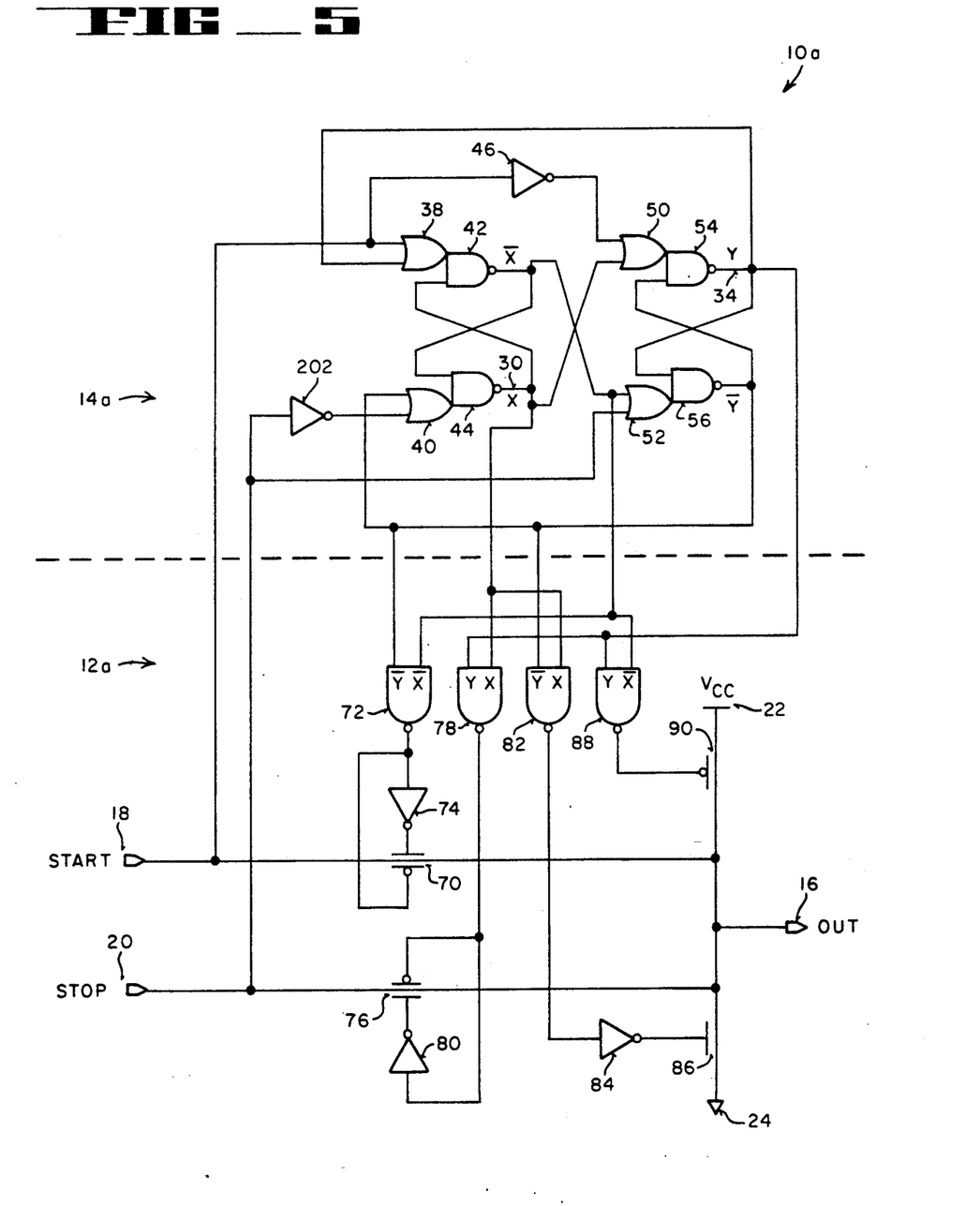
FIG. 5 is a schematic diagram of an alternative edge-sensitive pulse generator.

Pulse generator 10 can easily be modified to accomodate different polarity leading and trailing edges of both START 18 and STOP 20. Pulse generator 10 will treat the rising edge of START as its leading edge and the falling edge of STOP as its leading edge if modified as shown in FIG. 5. Pulse generator 10a of FIG. 5 differs slightly from embodiment 10 of FIG. 3. Inverter 75 has been removed, and the input of OR gate 52 connected directly to STOP 20. Inverter 202 has been added between STOP 20 and the input of OR gate 40. Given these alterations, pulse generation 10a operates much as described before with reference to FIG. 4; however, the falling edge of STOP 20 is treated as a leading edge.

Figure 6:
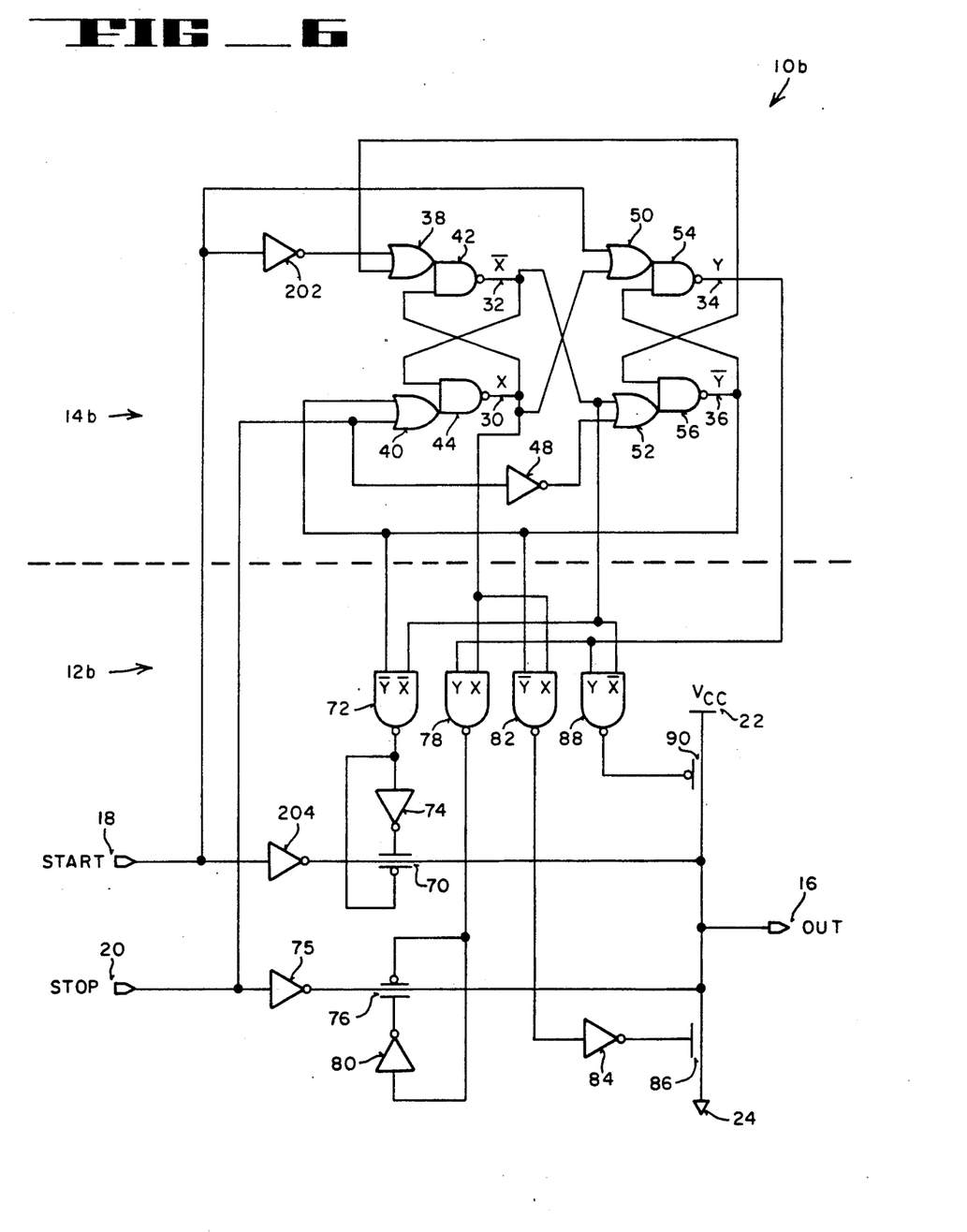
FIG. 6 is a schematic diagram of a second alternative edge-sensitive pulse generator.

Pulse generator 10 also can be modified to treat the falling edge of START 18 as a leading edge, while the rising edge of STOP continues to be treated as a leading edge. The modifications necessary are shown in FIG. 6, which illustrates alternative pulse generator 10b. Again the differences between pulse generator 10b and 10 are slight. Inverter 46 has been removed and the input of OR gate 50 connected to START 18. An inverter 202 has been inserted between START 18 and OR gate 38. Yet another inverter 204 has been inserted between START 18 and pass device 70. Given these modifications, pulse generator 10b operates as described with respect to FIG. 4 except that the falling edge of START 18 is treated as a leading edge.

Figure 7:
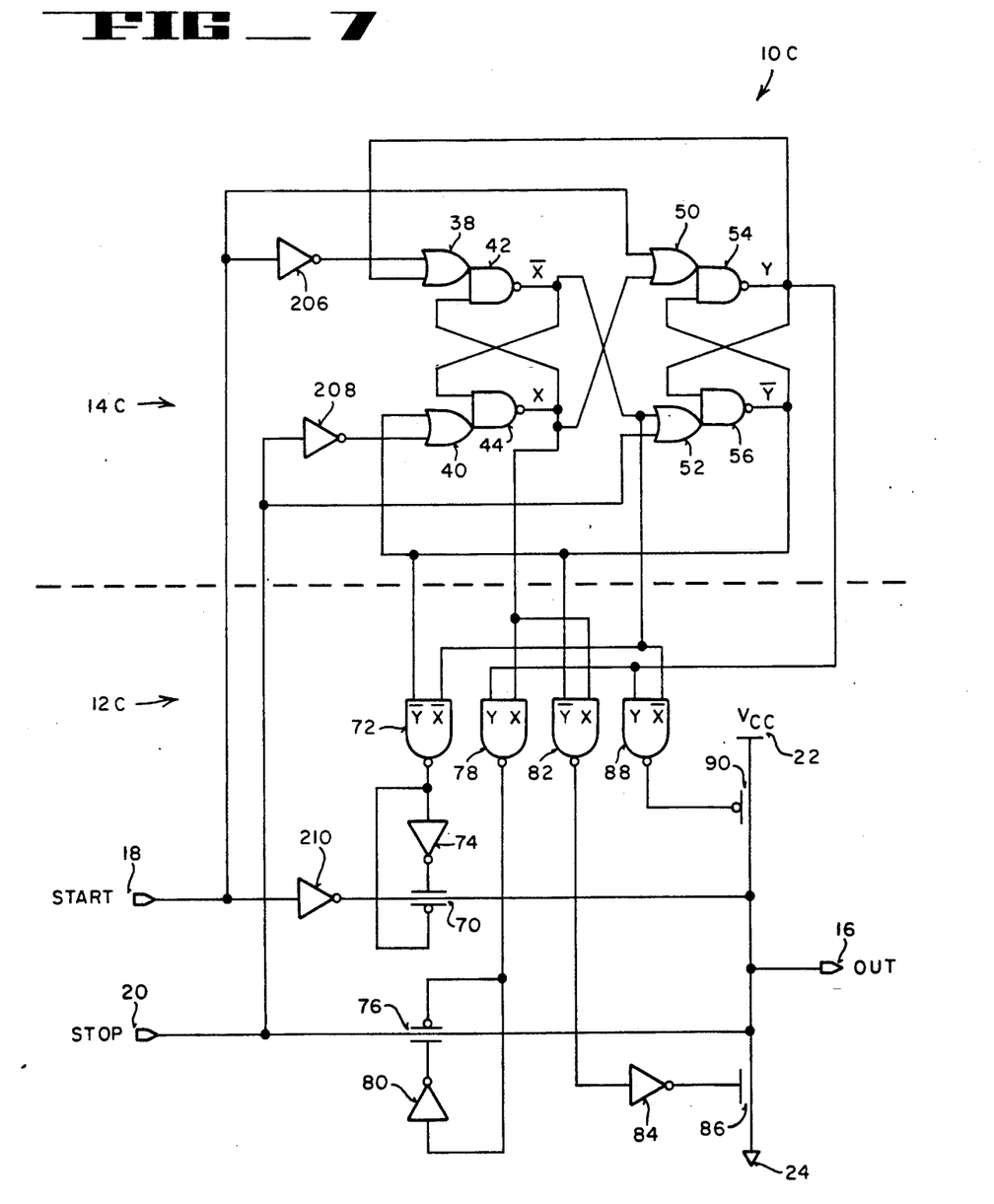
FIG. 7 is a schematic diagram of a third alternative edge-sensitive pulse generator.

Finally, pulse generator 10 can be modified as shown in FIG. 7 to treat the falling edges of both START and STOP as leading edges. In pulse generator 10c inverters 46, 48 and 75 have been removed. OR 50 has been connected to START 18 and OR 52 to STOP 20. Pass device 76 is also coupled directly to STOP 20. Inverter 206 is connected between START 18 and OR gate 38. Similarly, inverter 208 is connected between STOP 20 and OR gate 40. Inverter 210 is placed between START 18 and pass device 70. Again, pulse generator 10c operates substantially as described with reference to FIG. 4 except falling edges of both START 18 and STOP 20 are treated as leading edges.

Figure 8:
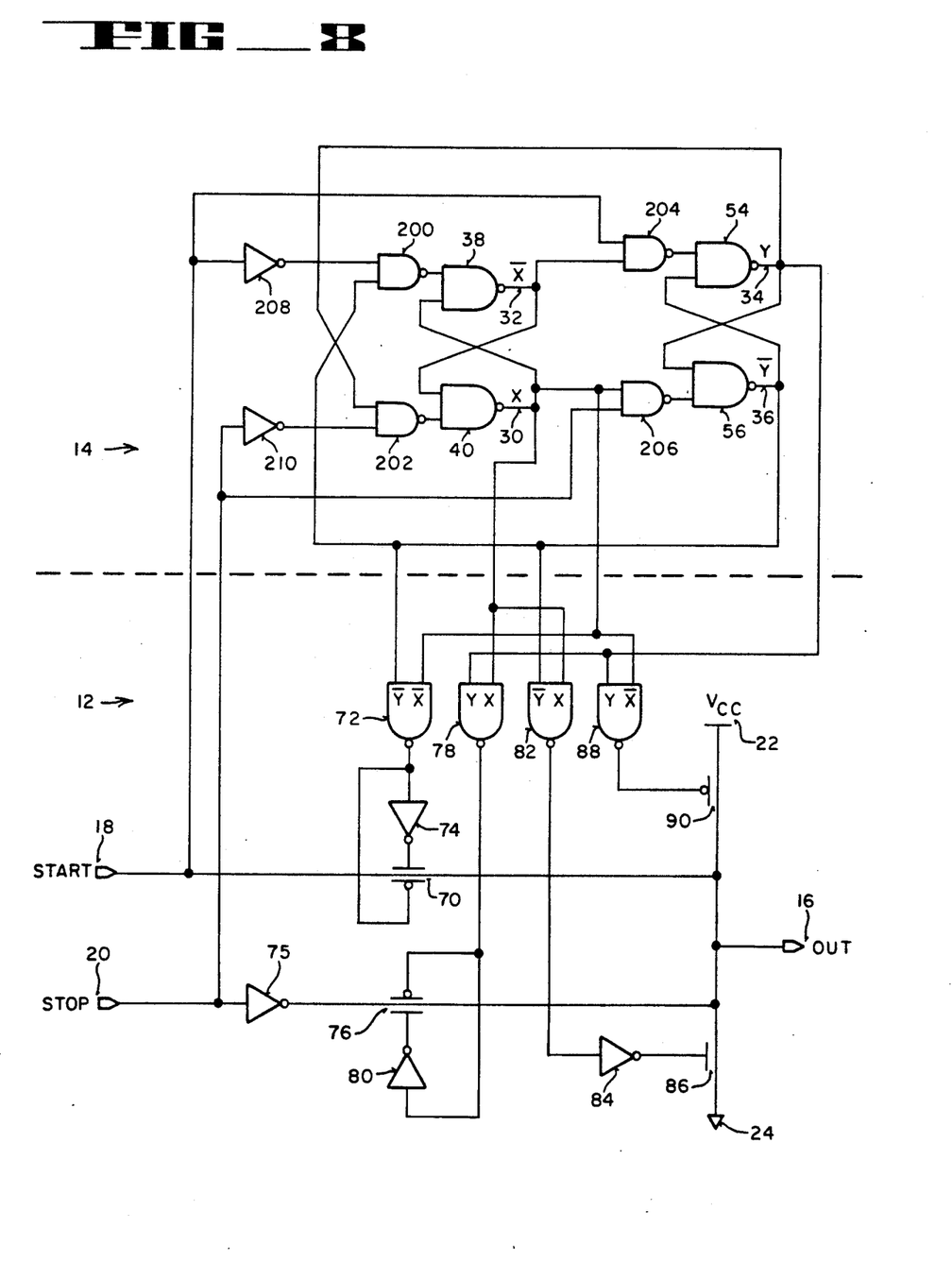
FIG. 8 is a schematic diagram of an alternative edge-sensitive pulse generator.

An alternative embodiment of control logic 14 is shown in FIG. 8. The control logic 14 shown differs from that of FIG. 3 in a number of ways. OR gates 38, 40, 54 and 56 have been replaced by NAND gates 200, 202, 204, and 206. Inverters 46 and 48 have been replaced by inverters 208 and 210. In addition to these device changes, the interconnection between gates differs. Control signal Y 34 is fed back around to NAND 202 and control signal $\overline{Y}$ 36 is applied to NAND 200. Control signal X is passed to NAND 206, while e,ovs/X/ 32 is passed to NAND 204. START 18 is input to NAND 204 and, through inverter 208, to NAND 200. Similarly, STOP 20 is input to NAND 206 and, through inverter 210, to NAND 202. Despite these differences, control signals X 30, e,ovs/X/ 32, Y 34, and e,ovs/Y/ 36 respond to START 18 and STOP 20 as does the embodiment of FIG. 3.

Thus, an edge-sensitive pulse generator has been described that includes control logic and a transmission gate multiplexor. The pulse generator is insensitive to the trailing edges of both START and STOP signals.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An edge-senstive pulse generator generating an output pulse having an arbitrary start time and an arbitrary stop time, comprising:
   a) a multiplexor outputting said output pulse on a multiplexor output in responses to control signals, said multiplexor having a first input coupled to a start signal, said start signal having a leading edge representative of said arbitrary start time, and a trailing edge, said multiplexor having a second input coupled to a stop signal, said stop signal having a leading edge representative of said arbitrary stop time and a trailing edge; and
   b) control logic for generating said control signals from said start signal and said stop signal, said control signals selecting said start signal as said multiplexor output after said trailing edge of said start signal, said control signals deselecting said start signal as said multiplexor output after said leading edge of said start signal, said control signals selecting said stop signal as said multiplexor output after said trailing edge of said stop signal, and said control signals deselecting said stop signal as said multiplexor output after said leading edge of said stop signal.

2. The edge-sensitive pulse generator of claim 1 wherein said leading edge of said start signal is a rising edge and said leading edge of said stop signal is a rising edge.

3. The edge-sensitive pulse generator of claim 1 wherein said leading edge of said start signal is a falling edge and said leading edge of said stop signal is a rising edge.

4. The edge-sensitive pulse generator of claim 1 wherein said leading edge of said start signal is a rising edge and said leading edge of said stop signal is a falling edge.

5. The edge-sensitive pulse generator of claim 1 wherein said leading edge of said start signal is a falling edge and said leading edge of said stop signal is a falling edge.

6. The edge-sensitie pulse generator of claim 1 wherein said control signals comprise a first control signal, a second control signal, a third control signal and a fourth control signal.

7. The edge-sensitive pulse generator of claim 6 wherein said control logic comprises:
   a) a first OR gate coupled to said start signal and to said first control signal;
   b) a second OR gate coupled to said stop signal and said second control signal;
   c) a first pair of cross coupled NAND gates generating said third control signal and said fourth control signal, one of said first pair of cross coupled NAND gates coupled to an output of said first OR gate and the other of said first pair of cross coupled NAND gates coupled to an output of said second OR gate;
   d) a thrid OR gate coupled of said fourth control signal and a complement of said start signal;
   e) a fourth OR gate coupled coupled to said third control signal and a complement of said stop signal; and
   f) a second pair of cross coupled NAND gates generating said first control signal and said second control signal, one of said second pair of cross coupled NAND gates coupled to an output of said third OR gate and the other of second pair of cross coupled NAND gates coupled to an output of said fourth OR gate.

8. An edge-sensitive pulse generator generating an output pulse having an arbitrary start time and an arbitrary stop time, comprising:
   a) a multiplexor for outputting said output pulse in response to control signals, wherein said control signals select one of a first multiplexor input, a second multiplexor input, a third multiplexor input and a fourth multiplexor input to be output from said multiplexor, said first multiplexor input being coupled to a start signal having a rising edge representative of said arbitrary start time and a falling edge, said second multiplexor input being coupled to a stop signal having a rising edge representative of said arbitrary stop time and a falling edge, said third multiplexor input being coupled to a low voltage level and said fourth multiplexor input being coupled to a high voltage level; and
   b) control logic for generating said control signals from said start signal and said stop signal, said control signals selecting said start signal after said falling edge of said start signal, selecting said fourth input after said rising edge of said start signal, selecting said stop signal after said falling edge said stop signal, and selecting said third input after said rising edge of said stop signal.

9. The edge-sensitive pulse generator of claim 8 wherein said control signals comprise a first control signal, a second signal, a thrid control signal and a fourth control singal.

10. The edge-sensitive pulse generator of claim 9 wherein said control logic comprises:
   a) a first OR gate coupled to said start signal and to said first control signal;
   b) a second OR gate couple to said stop signal and said second control signal;
   c) a first pair of cross coupled NAND gates generating said third control signal and said fourth control signal, one of said first pair of cross coupled NAND gates coupled to an output of said first OR gate and the other of said first pair of cross coupled NAND gates coupled to an output of said second OR gate;
   d) a first inverting means coupled to said start signal;
   e) a secone inverting means coupled toa said stop siganl;
   f) a third OR gate coupled to said fourth control signal and an output of said first inverting means;
   g) a fourth OR gate coupled to said third control signal and an output of said second inverting means; and
   h) a second pair of cross coupled NAND gates generating said first control signal and said second control signal, one of said second pair of cross coupled NAND gates coupled to an output of said third OR gates and the other of second pair of cross coupled NAND gates couple to an output of said fourth OR gate.

11. The edge-sensitive pulse generator of claim 8 wherenin said low voltage is approximately zero volts.

12. The edge-sensitive pulse generator of claim 8 wherein said high voltage is within a range fo 2.5 volts to 5 volts 13. The edge-sensitive pulse generator of claim 8 wherein said multiplexor is comprised of transmission gates.

14. An integrated circuit edge-sensitive integrated circuit pulse generator generating an output pulse having an arbitary start tiem and an arbitary stop time, comprising:
   a) a multiplexor for outputting said output pulse in response to control signals including a first control signal, a second control signal, a thrid control signal and a fourth control signal, wherein said control signals select one of a first multiplexor input, a second multiplexor input, a third multiplexor input and a fourth multiplexor input to be output from said multiplexor, said first multiplexor input being coupled to a start signal having a falling edge and a rising edge representative of said arbitary start time, said second multipexor input being coupled to a stop signal having a falling edge and a rising edge representative of said arbitary stop time, said thrid multiplexor input being coupled to a low voltage level and said fourth multiplexor input being coupled to a high voltage level; and
   b) control logic for generating said control signals from said start signal and said stop signal, said control signals selecting said start signal after said falling edge of said start signal, selecting said fourth input after said rising edge of said start signal, selecting said stop signal after said falling edge of said stop signal, and selecting said third input after said rising edge of said stop signal and wherein said control logic comprises:
      1) a first OR gate coupled to said start signal and to said first control signal;
      2) a second OR gate couple to side stop signal and said second control signal;
      3) a first pair of cross coupled NAND gates generating said third control signal and said fourth controls signal, one of said first pairs of cross coupled NAND gates coupled to an output of said first OR gate and the other of said first pair of cross coupled NAND gates coupled to an output of said second OR gate;
      4) a frist inverting means coupled to said start signal;

5) a second inverting means coupled to said stop signal;
6) a thrid OR gate coupled to said fourth control signal and an output of said first inverting means;
7) a fourth OR gate coupled to said third control signal and an output of said second inverting means, and
8) a second pair of cross coupled NAND gates generating said first control signal and said second contol signal, one of said second pair of cross coupled NAND gates coupled to an output of said third OR gate and the other of second pair of cross coupled NAND gates coupled to an output of said fourth OR gate.

15. The edge-sensitive pulse generator of claim 14 wherein said low voltage is approximately zero volts.

16. The edge-sensitive pulse generator of claim 14 wherein said high voltage is within a range of 2.5 volts to 5 volts.

17. The edge-sensitive pulse generator of claim 14 wherein said multiplexor is comprised of transmission gates.

* * * * *

UNITED STATES PATENT AND TRADEMARK OFFICE
CERTIFICATE OF CORRECTION

PATENT NO. : 5,138,188
DATED : 8/11/92
INVENTOR(S) : Mel Bazes

It is certified that error appears in the above-indentified patent and that said Letters Patent is hereby corrected as shown below:

Column 1, Line 22;  Delete "usign";  Insert in place thereof --using--

Column 1, Lines 30-31;  Delete "generaotr";  Insert in place thereof --generator--

Column 1, Line 36;  Delete "shwon";  Insert in place thereof--shown--

Column 1, Line 38;  Delete "shwon";  Insert in place thereof --shown--

Column 1, Line 58;  Delete "gnerator";  Insert in place thereof --generator--

Column 1, Line 65;  Delete "representativ";  Insert in place thereof --representative--

Column 1, Line 68;  Delete "in"

Column 2, Line 12;  Delete the second occurrence of "the"; Insert in place thereof --that--

Column 2, Line 19;  Delete "(a-f)"

Column 2, Line 42;  Delete "generators";  Insert in place thereof --generates--

UNITED STATES PATENT AND TRADEMARK OFFICE
CERTIFICATE OF CORRECTION

PATENT NO. : 5,138,188
DATED : 8/11/92
INVENTOR(S) : Mel Bazes

It is certified that error appears in the above-indentified patent and that said Letters Patent is hereby corrected as shown below:

Column 2, Line 61; After the word "time" Insert --for--
Column 3, Line 13; Delete "fals"; Insert in place thereof --falls--
Column 3, Line 27; After the word "other" Insert --two--
Column 3, Line 31; Delete "gater"; Insert in place thereof --gate--
Column 3, Line 33; Delete "siganl"; Insert in place thereof --signal--
Column 4, Line 2; Delete "idicate"; Insert in place thereof --indicate--
Column 6, Line 8; After "X" Insert --30--
Column 6, Line 9; Delete "e,ovs"; Insert in place thereof --X--
Column 6, Line 13; Delete "e,ovs/X/"; Insert in place thereof --X--
Column 6, Line 14; Delete "e,ovs"; Insert in place thereof --Y--
Column 6, Line 33; Delete "responses"; Insert in place thereof --response--
Column 7, Line 18; Delete "thrid"; Insert in place thereof --third--
Column 7, Line 20; Delete the second occurrence of "coupled"
Column 7, Line 57; Delete "thrid"; Insert in place thereof --third--
Column 7, Line 58; Delete "singal"; Insert in place thereof --signal--

UNITED STATES PATENT AND TRADEMARK OFFICE
CERTIFICATE OF CORRECTION

PATENT NO. : 5,138,188            Page 3 of 4

DATED : 8/11/92

INVENTOR(S) : Mel Bazes

It is certified that error appears in the above-indentified patent and that said Letters Patent is hereby corrected as shown below:

Column 7, Line 63;     Delete "couple";     Insert in place thereof --coupled--

Column 8, Line 5;     Delete "toa";     Insert in place thereof --to--

Column 8, Line 6;     Delete "siganl";     Insert in place thereof --signal--

Column 8, Line 16;     Delete "gates";     Insert in place thereof --gate--

Column 8, Line 17;     Delete "couple";     Insert in place thereof --coupled--

Column 8, Line 20;     Delete "wherenin";     Insert in place thereof --wherein--

Column 8, Line 29;     Delete "tiem";     Insert in place thereof --time--

UNITED STATES PATENT AND TRADEMARK OFFICE
CERTIFICATE OF CORRECTION

PATENT NO. : 5,138,188
DATED : 8/11/92
INVENTOR(S) : Mel Bazes

It is certified that error appears in the above-indentified patent and that said Letters Patent is hereby corrected as shown below:

| | | |
|---|---|---|
| Column 8, Line 33; | Delete "thrid"; | Insert in place thereof --third-- |
| Column 8, Line 44; | Delete "thrid"; | Insert in place thereof --third-- |
| Column 8, Line 58; | Delete "couple"; | Insert in place thereof --coupled-- |
| Column 8, Line 58; | Delete "side"; | Insert in place thereof --said-- |
| Column 8, Line 62; | Delete "pairs"; | Insert in place thereof --pair-- |
| Column 8, Line 67; | Delete "frist"; | Insert in place thereof --first-- |
| Column 9, Line 3; | Delete "thrid"; | Insert in place thereof --third-- |

Signed and Sealed this

Fourteenth Day of November, 1995

Attest:

BRUCE LEHMAN

*Attesting Officer*     *Commissioner of Patents and Trademarks*